United States Patent
Wang et al.

(10) Patent No.: US 8,932,928 B2
(45) Date of Patent: Jan. 13, 2015

(54) POWER MOSFET STRUCTURE AND METHOD

(71) Applicants: Peilin Wang, Beijing (CN); Edouard D. de Fresart, Tempe, AZ (US); Wenyi Li, Beijing (CN)

(72) Inventors: Peilin Wang, Beijing (CN); Edouard D. de Fresart, Tempe, AZ (US); Wenyi Li, Beijing (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/274,773

(22) Filed: May 12, 2014

(65) Prior Publication Data

US 2014/0342518 A1    Nov. 20, 2014

Related U.S. Application Data

(62) Division of application No. 13/609,281, filed on Sep. 11, 2012, now Pat. No. 8,759,909.

(30) Foreign Application Priority Data

May 14, 2012 (CN) ...................... 2012 1 0236232 A

(51) Int. Cl.

| H01L 21/336 | (2006.01) |
| H01L 29/78 | (2006.01) |
| H01L 29/66 | (2006.01) |
| H01L 29/423 | (2006.01) |
| H01L 21/28 | (2006.01) |
| H01L 29/08 | (2006.01) |

(52) U.S. Cl.
CPC .... *H01L 29/66734* (2013.01); *H01L 29/42368* (2013.01); *H01L 29/42376* (2013.01); *H01L 21/28114* (2013.01); *H01L 29/0865* (2013.01); *H01L 29/086* (2013.01)
USPC .... 438/270; 257/330; 257/335; 257/E29.262; 257/E21.41

(58) Field of Classification Search
USPC .......................... 438/270; 257/330, E29.262
See application file for complete search history.

(56) References Cited

U.S. PATENT DOCUMENTS

| 5,691,555 | A | 11/1997 | Zambrano |
| 6,144,085 | A | 11/2000 | Barker |
| 7,368,784 | B2 | 5/2008 | Botti |
| 7,554,152 | B1 | 6/2009 | Ranucci |
| 7,875,541 | B2 | 1/2011 | Tai |
| 7,939,882 | B2 | 5/2011 | Su |
| 7,977,739 | B2 | 7/2011 | Kachi |
| 2005/0272209 | A1 | 12/2005 | Yedinak |
| 2007/0075362 | A1 | 4/2007 | Wu |
| 2009/0108339 | A1 | 4/2009 | Wang |
| 2009/0250770 | A1 | 10/2009 | Su |
| 2011/0001189 | A1 | 1/2011 | Challa |

*Primary Examiner* — Mamadou Diallo
(74) *Attorney, Agent, or Firm* — Charles Bergere

(57) ABSTRACT

A power MOSFET includes a semiconductor substrate with an upper surface, a cavity of a first depth in the substrate whose sidewall extends to the upper surface, a dielectric liner in the cavity, a gate conductor within the dielectric liner extending to or above the upper surface, body region(s) within the substrate of a second depth, separated from the gate conductor in a lower cavity region by first portion(s) of the dielectric liner of a first thickness, and source region(s) within the body region(s) extending to a third depth that is less than the second depth. The source region(s) are separated from the gate conductor by a second portion of the dielectric liner of a second thickness at least in part greater than the first thickness. The dielectric liner has a protrusion extending laterally into the gate conductor away from the body region(s) at or less than the third depth.

10 Claims, 13 Drawing Sheets

POWER MOSFET STRUCTURE AND METHOD

BACKGROUND OF THE INVENTION

The present invention relates generally to semiconductor devices and, more particularly to a structure for a power metal-oxide-semiconductor-field-effect-transistors (MOSFETs).

The terms metal-oxide-semiconductor (MOS) and field-effect-transistor (FET), and the combination "MOSFET" have come into common use in the electronics arts for insulated gate field effect transistors (IGFETs) even though they may use any type of dielectric for the gate insulator and not just oxide insulators, and any type of conductor for the gate electrode not just metals. Accordingly, unless otherwise specifically noted, as used herein, the term "metal" in connection with MOSFETs is intended to include any type of conductor. Non-limiting examples of such conductors are metallic conductors, semi-metal conductors, alloy conductors, doped and undoped semiconductors, and mixtures and combinations thereof. Similarly, unless otherwise specifically noted, the term "oxide" in connection with MOSFETs is intended to include any type of organic or inorganic dielectric. Non-limiting examples of such dielectrics are oxide dielectrics, nitride dielectric, fluoride dielectrics, plastic materials and other types of inorganic and organic dielectrics as well as mixtures and combinations thereof. Further, the abbreviations MOSFET and IGFET and the terms for which they stand are used interchangeably herein.

Power MOSFETs are much used in electronic circuits and their utility depends on their properties and cost. Great effort has been expended and continues to be expended in improving their properties, manufacturing efficiency and cost, and there is an ongoing need for further improvements. Such improvements are crucially dependent on the structure and methods of manufacture of such MOSFETs.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
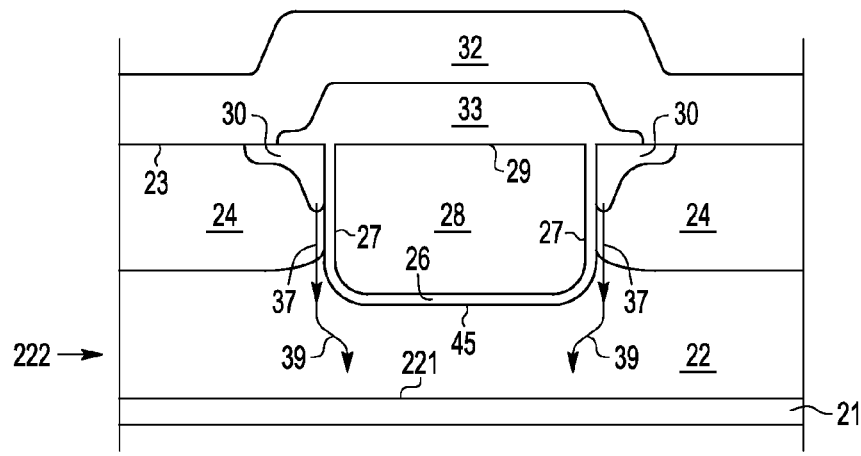
FIG. 1 shows a simplified schematic cross-sectional view of a conventional power MOSFET.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction and/or manufacture, and descriptions and details of well-known features and techniques may be omitted to avoid unnecessarily obscuring the invention. Additionally, elements in the drawing figures are not necessarily drawn to scale. For example, the dimensions of some of the elements or region(s) in the figures may be exaggerated relative to other elements or region(s) to help improve understanding of embodiments of the invention.

The terms "first," "second," "third," "fourth" and the like in the description and the claims, if any, may be used for distinguishing between somewhat similar elements and/or manufacturing steps and not necessarily for describing a particular spatial arrangement or sequence or chronological order. It is to be understood that the terms so used are interchangeable under appropriate circumstances such that embodiments of the invention described herein are, for example, capable of operation or construction in sequences, orientations and arrangements other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. The terms "substrate" and "semiconductor substrate" is intended to include any type of semiconductor containing substrate, whether single crystal or poly-crystalline or amorphous, and whether layered or homogeneous, as for example and not intended to be limiting, semiconductor-on-insulator (SOI) substrates and insulator on semiconductor (IOS) substrates.

Further, semiconductor region(s) are described herein as being of N type or P type. Persons of skill in the art will understand that identifying a particular device or region as being N type or P type is merely by way of example and not limitation and that devices or region(s) of opposite conductivity type may be substituted. Accordingly, reference to a first region as being, e.g., N-type and a second region as being e.g., P type is to be interpreted more generally as referring by way of example, to the first region being of a first conductivity type (which may be N or P type) and the second region(s) being of a second, opposite, conductivity type (which may then be P or N type). Further, while the devices described herein are referred to as "power MOSFETs" they are not limited to applications where relatively high power is being handled and may be used in any type of application where MOSFET action is desired. Accordingly, the term "power MOSFET", singular or plural, is to be interpreted broadly and not limited merely to power devices.

FIG. 1 shows a simplified schematic cross-sectional view of power MOSFET, 20 according to the prior art. MOSFET 20 comprises semiconductor substrate 22 (e.g., N type) having upper surface 23 and having drain region and contact 21 on lower surface 221 of substrate 22. Located within substrate 22 are body region(s) 24 (e.g., P type) extending to upper surface 23. Located within body regions 24 are source regions 30 (e.g., N-type) also extending to upper surface 23. Located between the combinations of body regions 24 and source regions 30 is cavity 25 that is lined with dielectric layer 26.

Dielectric layer 26 serves as the gate insulator. Located within cavity 25 and separated by dielectric layer 26 from substrate 22, body regions 24 and source regions 30, is conductive gate 28 having upper surface 29. Overlying conductive gate 28 is dielectric region 33. Overlying dielectric region 33 is source lead 32 that acts as one terminal of MOSFET 20 and which is Ohmically coupled to body regions 24 and source regions 30. Sidewall portion 27 of conductive gate 28 faces that part of body regions 24 lying between source regions 30 and underlying portion 222 of substrate 22. When conductive gate 28 is appropriately biased, conductive channel 37 is induced in body regions 24 between source regions 30 and underlying substrate 22, so that source-drain current 39 can flow from source regions 30, through body regions 24 and through underlying (e.g., drift space) portion 222 of substrate 22 to drain and drain contact 21. The magnitude of source-drain current 39 depends upon the magnitude and polarity of the voltage applied to conductive gate 28 and drain and drain contact 21.

Figure 2:
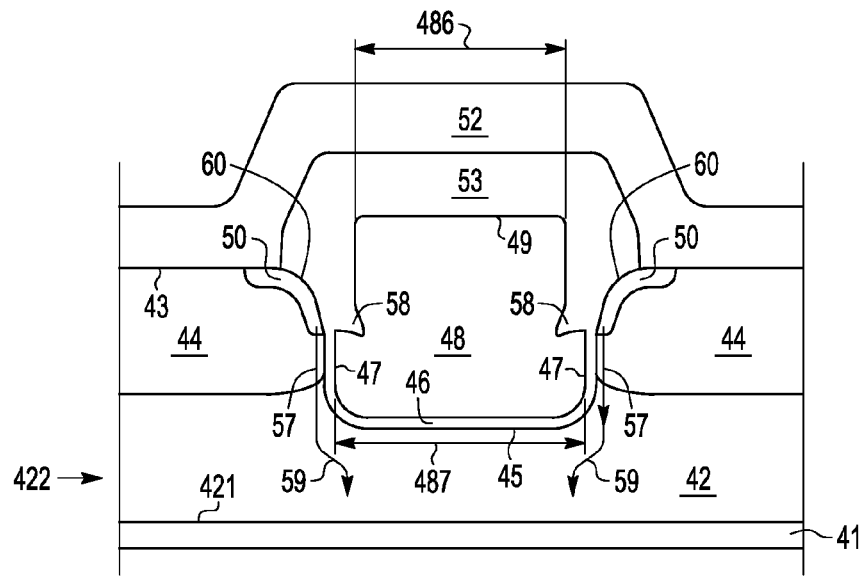
FIG. 2 shows a simplified schematic cross-sectional view of a power MOSFET in accordance with an embodiment of the present invention.
Figure 3:
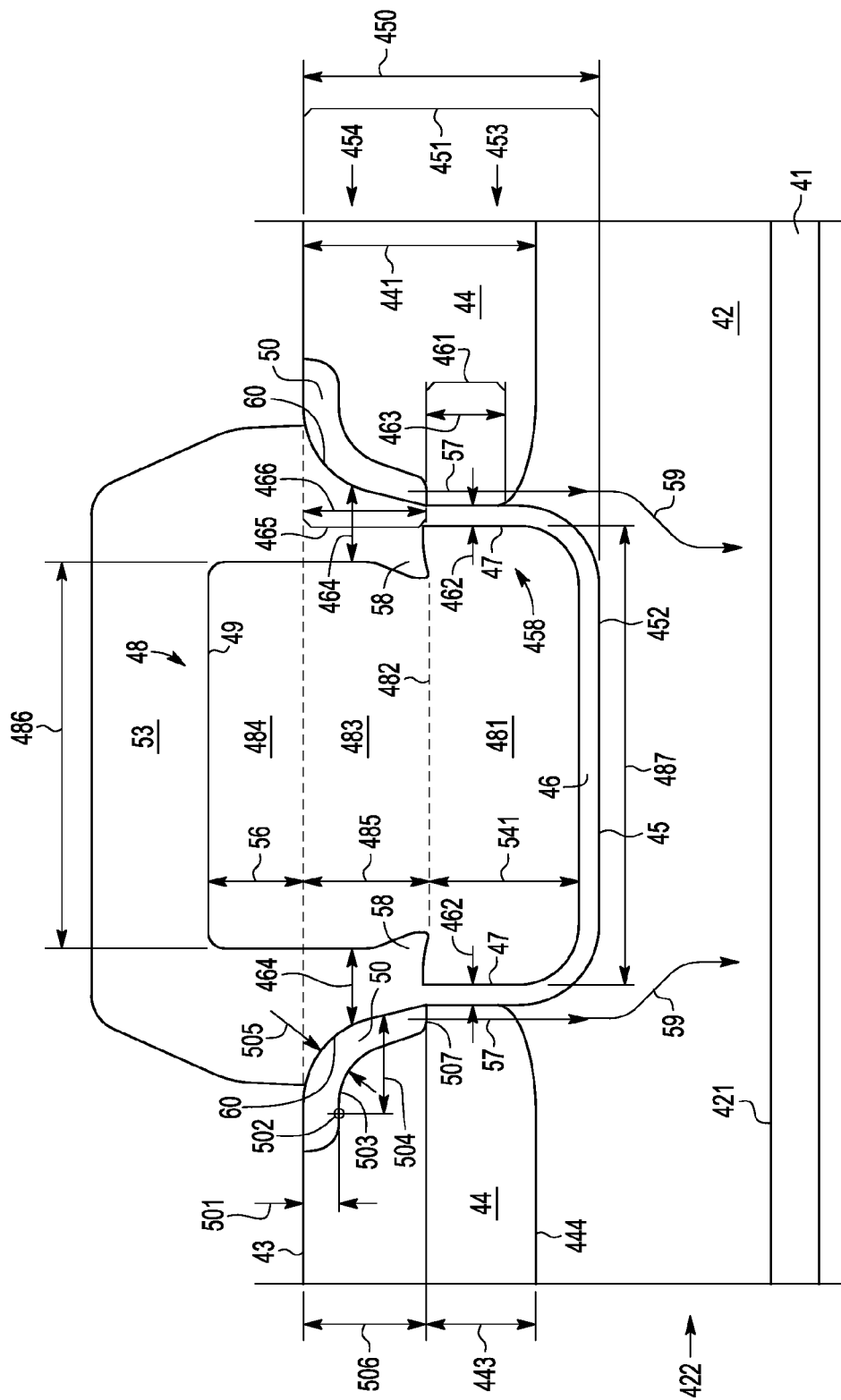
FIG. 3 shows a simplified schematic cross-sectional view of an enlarged central portion of the power MOSFET of FIG. 2 according to an embodiment of the present invention.
Figure 4:
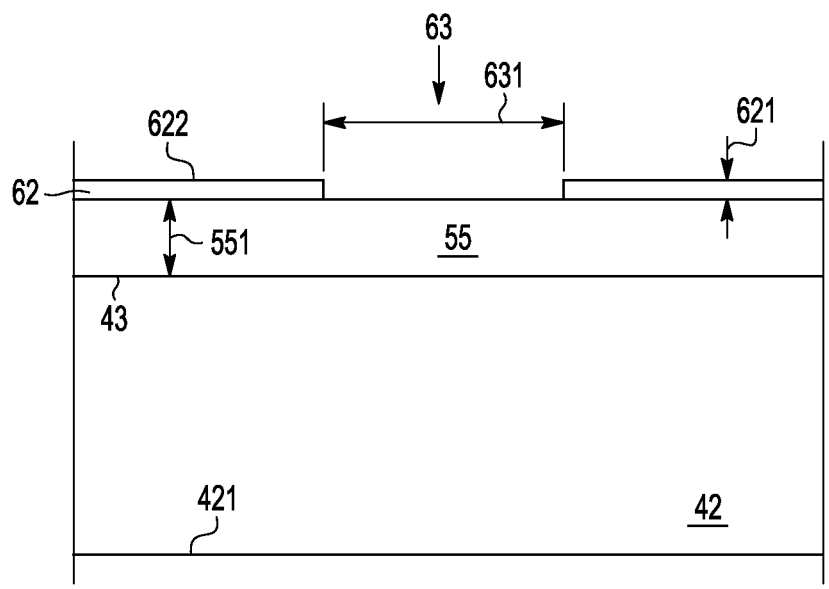
FIGS. 4-25 show simplified cross-sectional views of the MOSFET of FIGS. 2-3 at various stages of manufacture illustrating the structures formed in such manufacturing stages, according to further embodiments of the present invention.

FIG. 2 shows a simplified schematic cross-sectional view of power MOSFET 40, and FIG. 3 shows a simplified schematic cross-sectional enlarged view of central portion 401 of power MOSFET 40 of FIG. 2 showing greater detail, according to embodiments of the invention. FIGS. 2 and 3 are discussed together. The convention is doped in connection with FIGS. 2-25 of adding "(s)" to body region 44, source region 50, and so forth, to indicate that such terms may be either singular or plural. MOSFET 40 comprises semiconductor containing substrate 42 (e.g., N type) having upper (e.g., first) surface 43 and having drain region and contact 41 on lower (e.g., second) surface 421 of substrate 42. Located within substrate 42 are body region(s) 44 (e.g., P type) extending to substrate upper surface 43 and lower boundary 444 having depth 441 from upper surface 43 (see FIG. 3). Located within body region(s) 44 are source region(s) 50 (e.g., N-type) also extending to substrate upper surface 43. Located laterally between the combination of body region(s) 44 and source region(s) 50 is cavity 45 that is lined with dielectric layer 46. Dielectric layer or liner 46 is also referred to as gate insulator 46 or gate dielectric 46.

Cavity 45 has depth 450 from upper surface 43 of substrate 42. Cavity 45 has sidewall 451 and bottom 452 (see FIG. 3). Sidewall 451 extends from bottom 452 to substrate upper surface 43. Sidewall 451 has lower sidewall portion 453 and upper sidewall portion 454 discussed in more detail in connection with FIGS. 4-25. Similarly, dielectric layer 46 has lower dielectric portion 461 of vertical height 463 adjacent part of lower sidewall portion 453. Dielectric layer 46 also has upper dielectric portion(s) 465 of vertical height 466 adjacent upper sidewall portion 454, located between lower dielectric portion 461 and substrate upper surface 43. Lower dielectric portion 461 has lateral thickness 462 and upper dielectric portion(s) 465 has lateral thickness 464, generally greater than lateral thickness 462 of lower dielectric portion 461.

Located within cavity 45 and separated by dielectric layer 46 from substrate 42, body region(s) 44 and source region(s) 50 is gate conductor 48 having upper surface 49. Gate conductor 48 desirably comprises three portions or regions 481, 483, 484. Lower portion or region 481 of vertical thickness 541 overlies dielectric layer 46 on bottom 452 of cavity 45 and extends vertically to interface 482. Interface 482 is located about at the juncture between lower sidewall portion 453 and upper sidewall portion 454, which is also about at the juncture between lower dielectric portion 461 and upper dielectric portion(s) 465 as well as just about where dielectric protrusion 58 extends laterally into gate conductor 48. Intermediate gate conductor portion or region 483 of vertical thickness 485 overlies interface 482 and extends vertically approximately to the level of substrate upper surface 43. Gate conductor upper portion or region 484 desirably but not essentially extends vertically by distance 56 above about the level of substrate upper surface 43 to gate conductor upper surface 49. Gate conductor 48 has lateral width 486 above about interface 482 and dielectric protrusion 58, and larger lateral width 487 below interface 482 and protrusion 58, toward cavity bottom 452. Interface 482 and dielectric protrusion 58 are conveniently about at the same vertical level as lower extremity 507 of source region or region(s) 50, but that is not essential.

Overlying gate conductor 48 is dielectric region 53. Overlying dielectric region 53 is source lead 52 (see FIG. 2) that acts as one terminal of MOSFET 40 (e.g., the source contact) and which is generally Ohmically coupled to body region(s) 44 and source region(s) 50. To avoid cluttering the drawing source lead 52 is omitted in FIG. 3. A second terminal (e.g., the drain connection) is provided by drain and drain contact 41 on lower surface 421 of substrate 42, but other connection arrangements can also be used in other embodiments. While having source lead 52 in Ohmic contact with body region(s) 44 as well as with source region(s) 50 is common, it is not essential and such contacts may be provided separately in other embodiments Sidewall portion 47 of gate conductor 48 faces that part of body region(s) 44 lying between source region(s) 50 and underlying portion 422 of substrate 42, and may also face the part of source region(s) 50. When gate conductor 48 is appropriately biased, conductive channel 57 is induced in body region(s) 44 between source region(s) 50 and underlying portion 422 of substrate 42, so that source-drain current 59 can flow from source region(s) 50, through body region(s) 44 and through the underlying (e.g., drift space) portion 422 of substrate 42 to drain and drain contact 41. The magnitude of source-drain current 59 depends upon the magnitude and polarity of the voltage applied to gate conductor 48 with respect to body region(s) 44 and the voltage applied to drain and drain contact 21 with respect to source region(s) 50. In connection with FIGS. 19-25, source region(s) 50 of FIGS. 2-3 may be referred to as "final" source region(s) 50 to distinguish them from initial source region(s) 50' formed, for example, during manufacturing stage 518 of FIG. 18. A similar convention is followed with respect to other device region(s) or elements wherein initial or intermediate region(s) or elements formed during the manufacturing process use the same reference number as the final region(s) or elements to which they relate, but are distinguished by addition of a prime (') or double prime (") to the initial or intermediate versions.

Power MOSFET 40 differs from prior art MOSFET 20 in several respects. For example, gate dielectric 46 varies in thickness along sidewall 451 of cavity 45 where gate conductor 48 is located. During operation of MOSFET 40, an electric field exists between source region(s) 50 and gate conductor 48 in gate dielectric 46. Gate dielectric 46 has smaller thickness 462 in lower (e.g., first) dielectric portion 461 (e.g., see FIG. 3) where channel region 57 is formed and significantly larger thickness 464 in upper (e.g., second) dielectric portion(s) 465. This comes about because of the additive effects of: (i) gate conductor 48 generally having smaller lateral width 486 in its upper portion, e.g., proximate upper dielectric portion(s) 465, and larger lateral width 487 in its lower portion, e.g., proximate lower dielectric portion 461; (ii) gate dielectric 46 has dielectric protrusion 58 extending laterally into gate conductor 48 and whose lower extremity lies at depth 585 below substrate upper surface 43 and at height 541 above dielectric layer 46 on bottom 452 of cavity 45. Depth 585 is desirably similar to or less than depth 506 of lower extremity 507 of source region(s) 50 and to height 466 of upper dielectric portion(s) 465; and (iii) source region(s) 50 have curved shape 60 in upper sidewall portion 454 proximate upper dielectric portion(s) 465, so that lateral thickness 464 of gate dielectric 46 in upper dielectric portion(s) 465 above dielectric protrusion 58 generally increases approaching upper surface 43. Upper dielectric portion(s) 465 includes protrusion 58. Distances 506, 585 and 466 are desirably approximately similar although that is not essential, keeping in mind that depth 506 of lower extremity 507 of source(s) 50 should be equal to or greater than depth 585 of the lower extremity of dielectric protrusion 58, otherwise channel 57 may not form completely proximate gate extremity 507. Thicker upper dielectric portion(s) 465 arising from smaller gate conductor width 486 in upper dielectric portion(s) 465 versus larger gate conductor width 487 proximate lower dielectric portion 461 and below, curved shape 60 proximate upper dielectric portion(s) 465, and dielectric protrusion 58 act to reduce the electric field between gate conductor 48 and source region(s) 50, thereby making MOSFET 40 less susceptible to gate-source breakdown. Moreover, this benefit is obtained without reducing the gain of MOSFET 40 since thicker upper dielectric portion(s) 465 does not extend significantly below lower extremity 507 of source region(s) 50, below which channel 57 is induced in body region(s) 44 by bias on gate conductor 48.

Distance 56 between upper surface 49 of gate conductor 48 and substrate upper surface 43 is desirably equal or greater than zero. Having gate conductor 48 extend above substrate upper surface 43 (e.g., by distance 56) can decrease the series gate resistance Rg of MOSFET 40 because the cross-sectional area of gate 48 increases with increasing height 56 of gate 48. Since the series gate resistance Rg contributes to the gate time constant Cg*Rg, reducing Rg improves the high frequency performance and reduces the switching time of transistor 40. This is highly desirable. Distance 56 is preferably in the range of about 20% to 50% of cavity depth 450, but larger and smaller distances may also be used. It will be noted that boundary 503 of source region(s) 50 where source region(s) 50 form an NP or PN junction with body region(s) 44 is curved, generally similar to curved shape 60, that is, concave downward or, equivalently, convex upward. Stated another way, depth 501 below upper substrate surface 43 of any point 502 on source region(s) boundary 503 generally increases as separation 504 of point 502 from curved shape 60 facing gate conductor 48 decreases. This can result in source width 505 between curved shape 60 of source region(s) 50 and NP or PN junction lower source region(s) boundary 503 being somewhat constant a considerable way along lower source region(s) boundary 503 or curved shape 60. This can also result in source region(s) 50 having a somewhat banana-like shape, as is illustrated by way of example in FIGS. 2 and 3, although that is not essential. While each of these features individually contributes positively to improved device performance, collectively their beneficial impact is additive, making the illustrated embodiment highly desirable.

FIGS. 4-25 show simplified cross-sectional views of MOSFET 40 of FIGS. 2 and 3 at various stages 504-525 of manufacture, illustrating structures 604-625 formed by manufacturing stages 504-525, according to further embodiments of the invention. Referring now to manufacturing stage 504 of FIG. 4, substrate 42 having upper (e.g., first) surface 43 and lower (e.g., second) surface 421 is provided. By way of example and not limitation, substrate 42 can be N-type with variable or uniform doping or of P-type doping, depending on whether an NPN or PNP transistor is desired.

Figure 5:
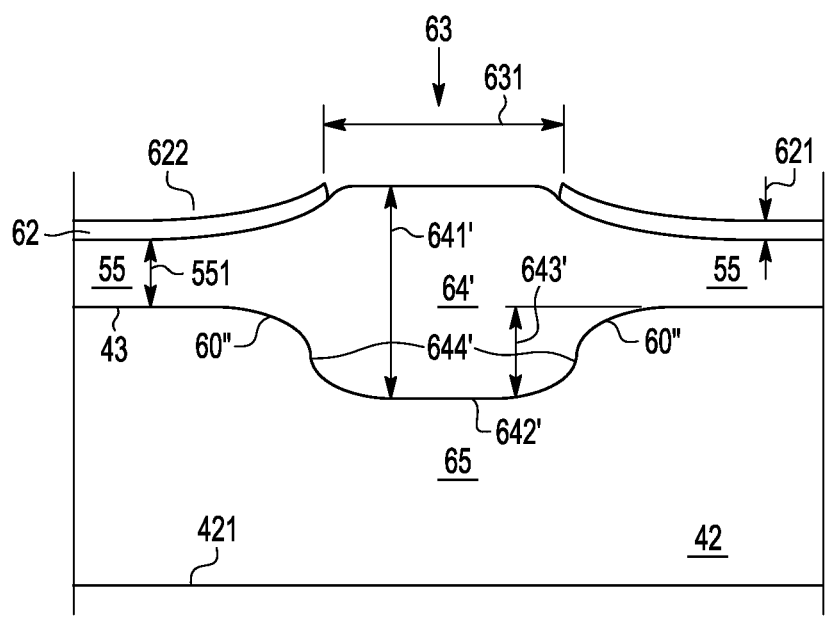

Overlying substrate upper surface 43 is dielectric layer 55. Where substrate 42 comprises silicon, silicon oxide is suitable for dielectric layer 55 but other insulating materials may also be used. Thickness 551 of dielectric layer 55 will depend on whether dielectric layer 55 is being used merely as a thin surface protective (e.g., "pad" oxide) dielectric layer or as a thicker dielectric layer that can subsequently provide field oxide or other isolating dielectric region(s) either associated with MOSFET 40 or other devices in the IC of which MOSFET 40 may form a part, but this is not essential. Those of skill in the art will understand how to choose thickness 551 depending upon the particular function intended for dielectric layer 55. Overlying dielectric layer 55 is hard mask layer 62 having opening 63 of lateral width 631, thickness 621 and upper surface 622. During formation of opening 63 in hard mask layer 62 the portion of dielectric layer 55 underlying opening 63 can be left in place or removed, as for example by differential etching. Either arrangement is useful. For convenience of explanation, it is assumed that dielectric layer 55 is initially left in place under opening 63 until later manufacturing stages. Lateral width 631 of opening 63 substantially determines lateral extent 487 of gate conductor 48 of MOSFET 40 (e.g., see FIGS. 2-3) and is within the discretion of the MOSFET designer.

Where dielectric layer 55 is of silicon oxide, then mask layer 62 of thickness 621 can be conveniently of silicon nitride, but other hard mask materials may also be used. The purpose of mask layer 62 is to protect underlying region(s) of substrate 42 during formation of thicker dielectric region 64' of FIG. 5. In a preferred embodiment, dielectric region 64' of FIG. 5 is formed by local oxidation of semiconductor (LOCOS) of substrate 42 underlying mask opening 63. Where substrate 42 comprises silicon and region 64' of FIG. 5 is intended to be of silicon oxide, thickness 621 is usefully in the range of at least about 100 nanometers (nm), but thicker and thinner layers may also be used. Thickness 551 of (e.g., oxide) dielectric layer 55 is usefully at least about 50-80 nm, but thicker and thinner layers may also be used. Structure 604 results.

Referring now to manufacturing stage 505 of FIG. 5, structure 604 is conveniently subjected to a hot and/or activated oxygen atmosphere so that LOCOS dielectric region 64' of thickness 641' forms beneath opening 63 of width 631 in mask layer 62. LOCOS formation of dielectric region 64' is conventional and LOCOS technology is well known in the art. Thickness 641' of LOCOS region 64' will depend upon the particular device being designed and the choice of thickness 641' is within the competence of persons of skill in the art. In a preferred embodiment, thickness 641' between bottom 642' and the top of LOCOS region 64' is conveniently about 200 to 1000 nm, and distance 643' between bottom 642' and upper surface 43 of substrate 42 is conveniently about 30 to 50 percent of thickness 641', but thicker and thinner region(s) may also be used.

Part of substrate 42 underlying opening 63 is consumed during formation of, e.g., LOCOS, dielectric region 64', for example by being converted from semiconductor (e.g., silicon) to dielectric (e.g., silicon dioxide). As a consequence, bottom 642' of dielectric region 64' is depressed below original upper surface 43 of substrate 42, which remains substantially unaffected laterally beyond an oxygen diffusion length from opening 63. Because of the lateral diffusion of oxygen during formation of dielectric region 64', sidewalls 644' of dielectric region 64' have curved shape 60" as they approach substrate upper surface 43. As will be subsequently explained, curved shape 60" is desirable and although the LOCOS process provides such sidewall curvature, other processes resulting in sidewalls 644' with substantially curved shape 60" may also be used to form dielectric region 64'. The use of the double prime (") with respect to curved shape 60" indicates that this is a precursor to final curved shape 60 of FIGS. 2-3. The radius of curved shape 60" may change somewhat during subsequent process stages, so that curved shape 60 occurs over a greater lateral distance from opening 63, but that is not essential. Portion 65 of substrate 42 underlies bottom 642' of dielectric region 64'. Structure 605 results.

Figure 6:
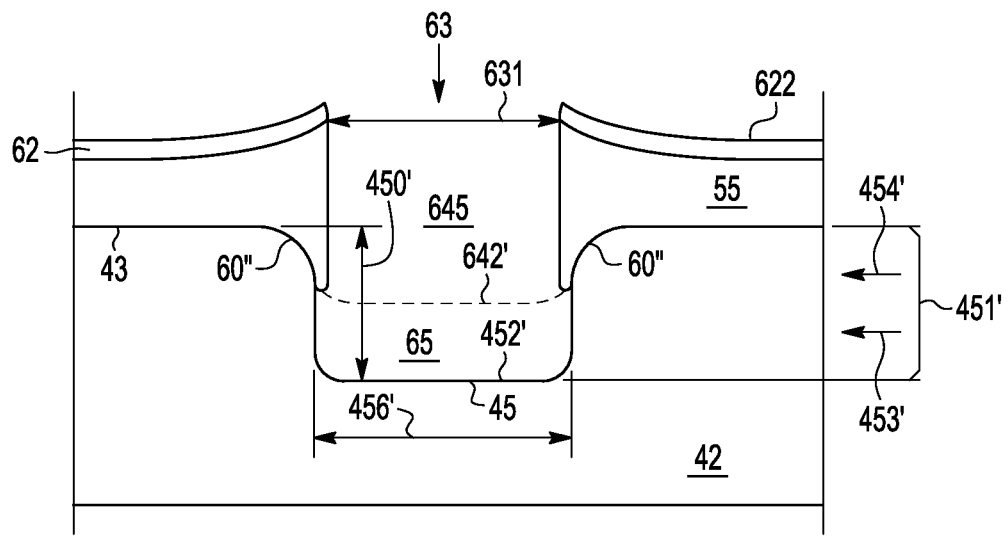

Referring now to manufacturing stage 506 of FIG. 6, structure 605 is etched below opening 63 where structure 605 is not protected by hard mask 62. However, if significant erosion of mask layer 62 is encountered a further overlying mask (not shown) with a substantially similar opening may also be used. Passage 645 is etched through dielectric region 64' (see FIG. 5) overlying bottom 642'. Etching continues into portion 65 of substrate 42 underlying bottom 642' of dielectric region 64' of FIG. 5, thereby forming cavity 45' of lateral width 456' therein. Cavity 45' has bottom 452', sidewalls 451' and depth 450' below upper surface 43 of substrate 42. Etching of dielectric region 64' is desirably anisotropic. Etching of underlying portion 65 of substrate 42 is also initially desirably anisotropic, followed by a brief isotropic etch of those portions of substrate 42 exposed in cavity 45' beneath interface 642'. This results in width 456' of lower portion 453' of cavity 45' being slightly larger than width 631 of the opening in the dielectric remaining in upper portion 454'.

Where substrate 42 is of silicon, depth 450' is conveniently in the range of about 0.4 to 2.0 micrometers, but other depths may also be used. Plasma etching is a convenient means of etching LOCOS region 64' of FIG. 5 and portion 65 of substrate 42 (see FIG. 5) to form cavity 45', but other etching techniques may also be used. Reagent gases for accomplishing such plasma etching of dielectric and semiconductor are well known in the art and will depend upon the particular dielectric used for region 64' (see FIG. 5) and the particular semiconductor chosen for substrate 42. Width 631 of opening 63 in mask layer 62 primarily determines width 456' of cavity 45'. However, width 456' may slightly exceed width 631 if an isotropic etch is used after cavity 45' has been primarily formed, as is desirable but not essential. Structure 606 results.

Figure 7:
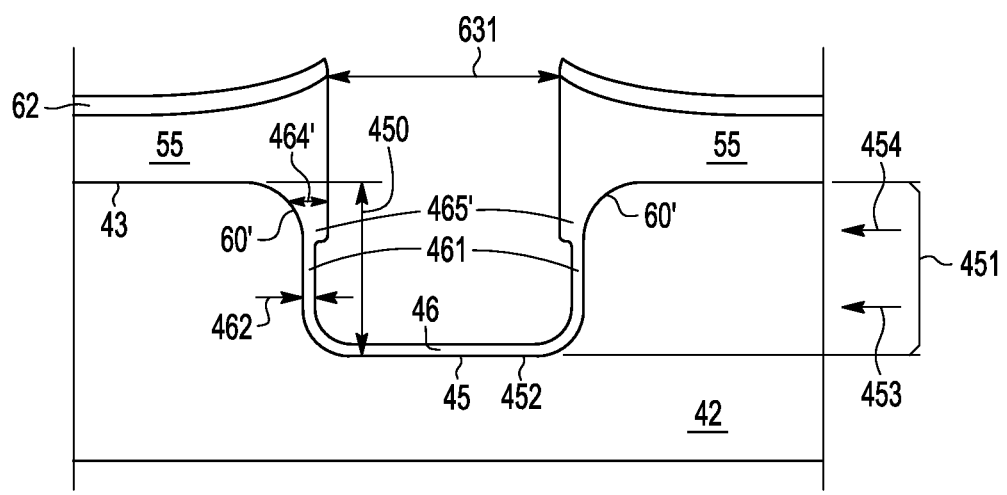

Referring now to manufacturing stage 507 of FIG. 7, gate dielectric 46 is desirably formed on (see FIG. 6) bottom 452' and lower portion 453' of sidewall 451' of cavity 45' of depth 450'. After formation of gate dielectric 46, these regions are referred to respectively as bottom 452, sidewalls 451, lower portion 453 and depth 450 of cavity 45 since their location or magnitude may change by a small amount if, for example, gate dielectric 46 is formed by thermal oxidation of the surfaces of substrate 42 exposed in cavity 45' of FIG. 6. Sidewalls 451 comprises lower sidewall portion 453 wherein portion 461 of gate dielectric 46 has lateral thickness 462 and upper sidewall portion 454 encompassing curved shape 60' wherein upper portion(s) 465' of gate dielectric 46 has larger lateral thickness 464'.

Where substrate 42 comprises silicon, gate dielectric 46 is conveniently of silicon oxide, but other dielectric materials may also be used. In a preferred embodiment, thickness 462 is conveniently in the range of about 5 to 150 nm, but thicker and thinner layers may also be used. Thermal oxidation or deposition is a convenient way of forming gate dielectric 46, but other techniques well known in the art may also be used, depending on the choice of material for gate dielectric 46. Upper portion(s) 465' of gate dielectric 46 on curved shape 60' has lateral thickness 464', where the use of primes (') here indicates that such elements are precursors to final dielectric portion(s) 465 of thickness 464 on curved shape 60 of FIG. 3. Structure 607 results.

Figure 8:
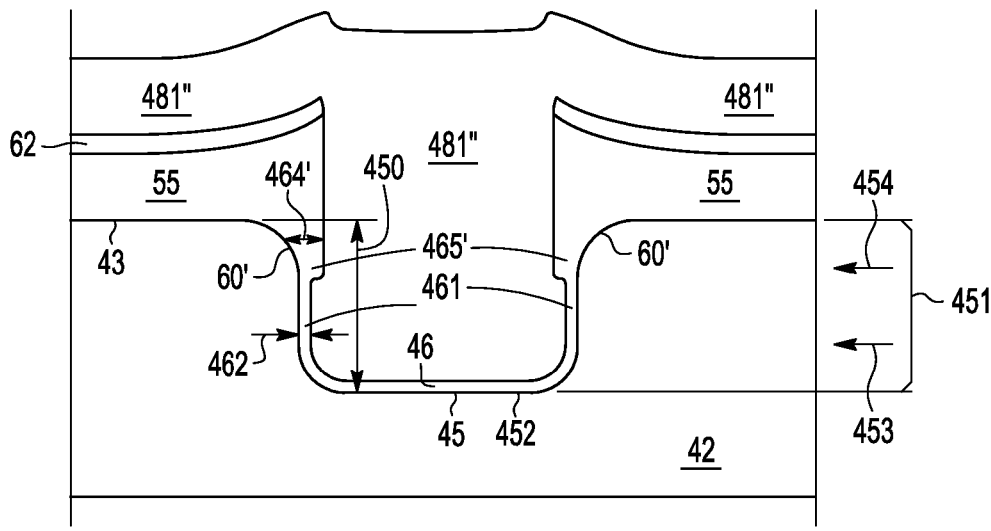

Referring now to manufacturing stage 508 of FIG. 8, cavity 45 is filled with conductor 481". Conductor 481" is desirably polycrystalline semiconductor (e.g., silicon) but other relatively conductive materials may also be used. For convenience of description and not intended to be limiting, conductor 481" is also referred to as "first poly" or "first conductor" 481". When first conductor 481" comprises silicon, it desirably has relatively high conductivity, and preferably of the same conductivity type as substrate 42, e.g. N type, although other conductivity and type may also be used. Chemical vapor deposition (CVD) is a suitable technique for forming first conductor 481", although other deposition techniques well known in the art may also be used. Overlying dielectric layer 55 and mask layer 62 are desirably left in place during deposition of first conductor 481", but that is not essential. Conductor 481" is formed within lower portion 461 and upper portion(s) 465' of dielectric layer 46 to a depth exceeding cavity depth 450. Structure 608 results.

Figure 9:
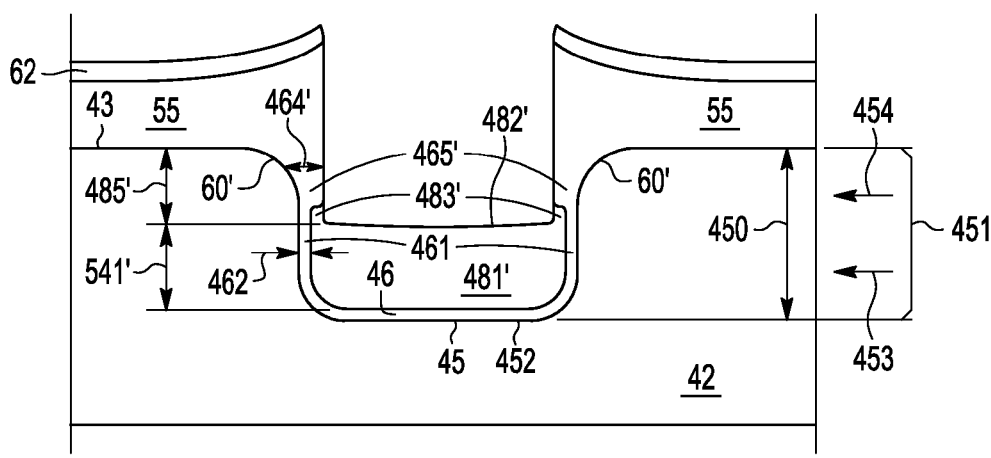

Referring now to manufacturing stage 509 of FIG. 9, structure 608 is desirably etched to remove the upper portion of conductor 481", leaving behind conductor portion 481' of thickness 541' having upper surface 482' in cavity 45. Anisotropic etching is preferred. Plasma etching is a non-limiting example of a suitable etching technique and is well known in the art. As will be subsequently shown, conductor 481' forms a portion of gate conductor 48 of MOSFET 40. In a preferred embodiment, upper surface 482' of conductor 481' lies below substrate upper surface 43 by amount 485'. The etching process also desirably leaves behind portions 483' of conductor 481" above upper surface 482' of conductor 481' proximate upper portion(s) 465' of gate dielectric 46 adjacent curved shape 60'. Any method for providing conductor portions 483' may be used. Structure 609 results.

Figure 10:
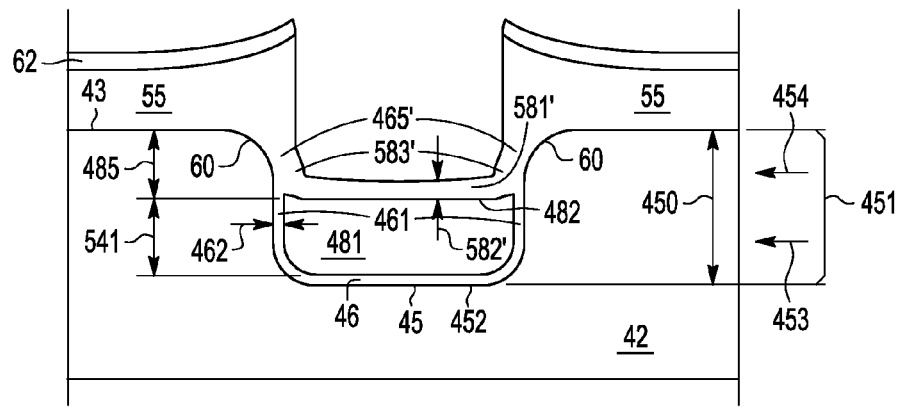

Referring now to manufacturing stage 510 of FIG. 10, surface 482' of conductor 481' in cavity 45 is converted to dielectric 581', as for example, but not intended to be limiting, by thermal oxidation of some of the material of conductor 481'. Dielectric 581' has thickness 582' above surface 482 of remaining conductor 481 in cavity 45. Thickness 582' is usefully in the range of about 10 to 300 nm, but larger or smaller thicknesses may also be used. Portions 483' of conductor 481' (see FIG. 9) proximate curved shape 60' are converted to dielectric 583' during the formation of dielectric region 581'. Following this conversion, remaining portion 481 in cavity 45 has thickness 541 with upper surface 482 that lies at distance 485 below upper surface 43 of substrate 42. Structure 610 results.

Figure 11:
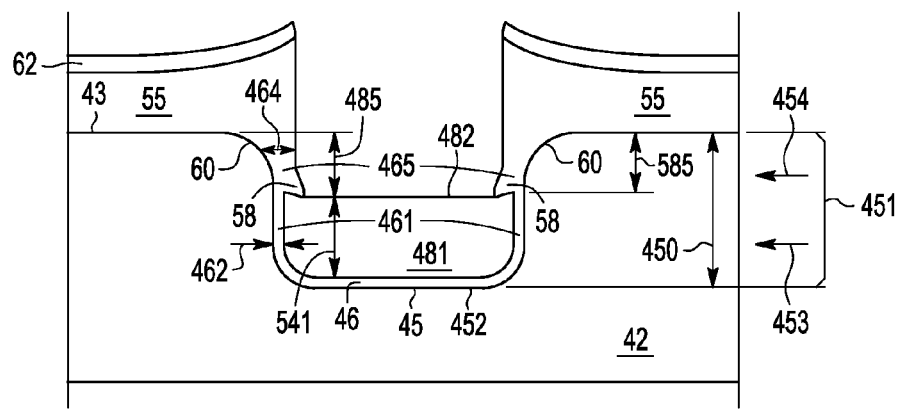

Referring now to manufacturing stage 511 of FIG. 11, dielectric regions 581', 583' are etched so that dielectric region 581' and the upper part of dielectric region 583' are substantially removed. Anisotropic etching is preferred. Dielectric protrusions 58 along sidewalls 451 of cavity 45 and of depth 585 from SC surface 43 are left behind, extending laterally into cavity 45. Dielectric region(s) 58 are proximate the lower ends of curved shape 60 and about at or just above surface 482 of remaining conductor 481 in cavity 45. Surface 482 is approximately at the interface or between lower sidewall region 453 and upper sidewall region 454. Surface 482 lies at distance 485 below substrate upper surface 43 and at height 541 above the lower edge of remaining conductor 481 in cavity 45. Upper dielectric portion(s) 465 of lateral thickness 464 are proximate curved shape 60 of upper sidewall portions 454. Plasma etching is a non-limiting example of a suitable technique for removing dielectric region 581' and the upper parts of dielectric region 583'. Structure 611 results. Referring now to manufacturing stage 512 of FIG. 12, mask layer 62 of structure 611 is removed using any of the various means well known in the art, depending upon the choice of material for mask layer 62, thereby exposing upper surface 552 of dielectric layer 55. Structure 612 results.

Figure 12:
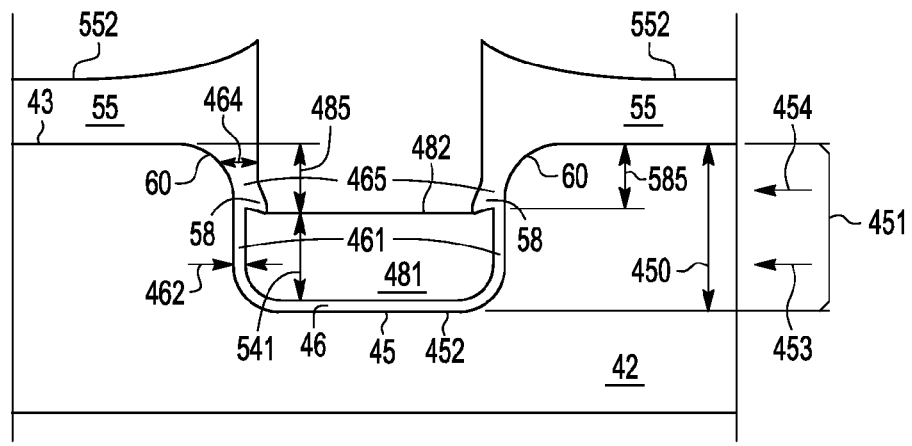
Figure 13:
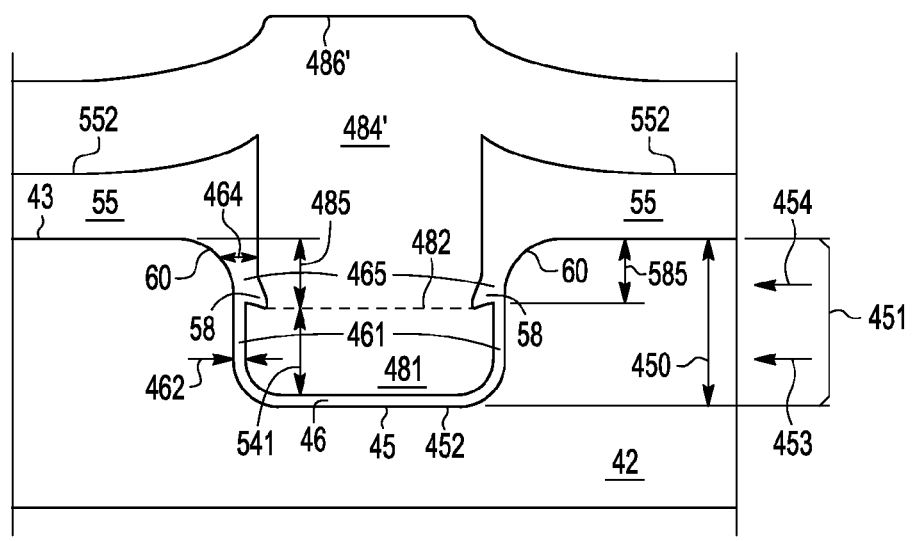

Referring now to manufacturing stage 513 of FIG. 13, conductor 484' is deposited over structure 612, over surfaces 552 and 482, and substantially filling cavity 45 including at least part of the region where dielectric region 64' (see FIG. 5) was located. Surface 482 of FIG. 12 is referred to as "interface" 482 hereafter and in connection with FIG. 3. It is not essential that former dielectric region 64' up to surface 552 proximate cavity 45 be completely filled by conductor 484', but it is desirable that upper surface 486' of conductor 484' lie above upper surface 43 of substrate 42. Conductor 484' is conveniently of the same material as conductor 481" applied in FIG. 8 (e.g., doped poly silicon); although its conductivity need not be the same and other materials may also be used. N-type poly-silicon formed by CVD is a non-limiting example of a suitable material and deposition technique for conductor 484', but other materials and deposition techniques may also be used. For convenience of description and not intended to be limiting, material 484' is also referred to as "second poly" or "second conductor" 484'. Structure 613 results.

Figure 14:
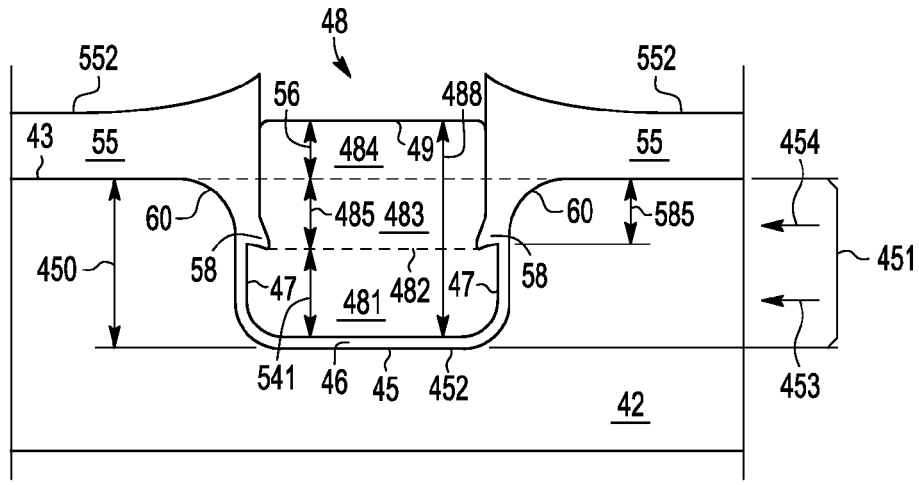

Referring now to manufacturing stage 514 of FIG. 14, structure 613 is conveniently etched to remove the upper portion of conductor 484' leaving behind portions 484 and 483. Portion 484 is shown as being uppermost and has upper surface 49. Portion 483 lies between portion 484 and conductor 481. Portions 484 and 483 overlie interface 482 of conductor 481 in cavity 45. The combination of portions 484, 483 and 481 forms gate conductor 48 of MOSFET 40 of FIGS. 2-3. Gate conductor 48 has upper surface 49 and overall thickness 488. Upper surface 49 overlies upper surface 43 of substrate 42 by distance 56. Distance 56 is desirable greater than zero and preferably at least about 20%-50% of cavity depth 450, but larger and smaller depths may also be used. Structure 614 results.

Figure 15:
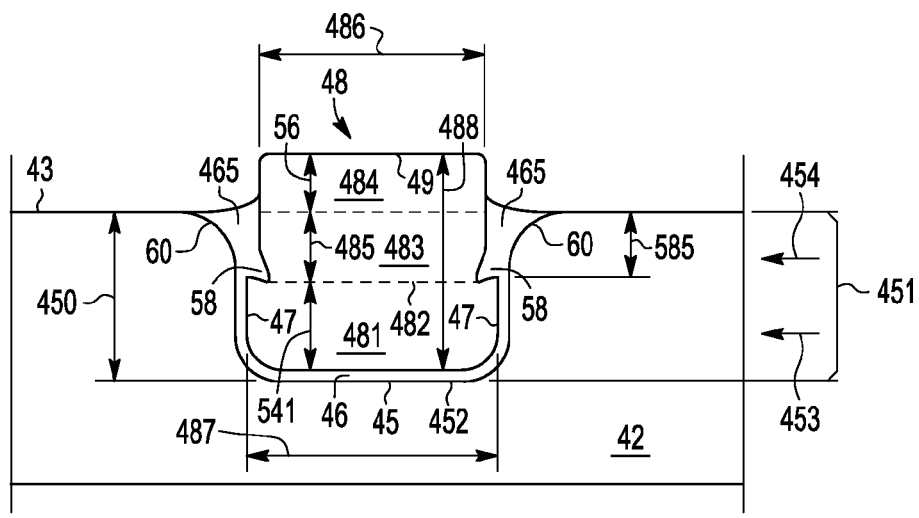
Figure 16:
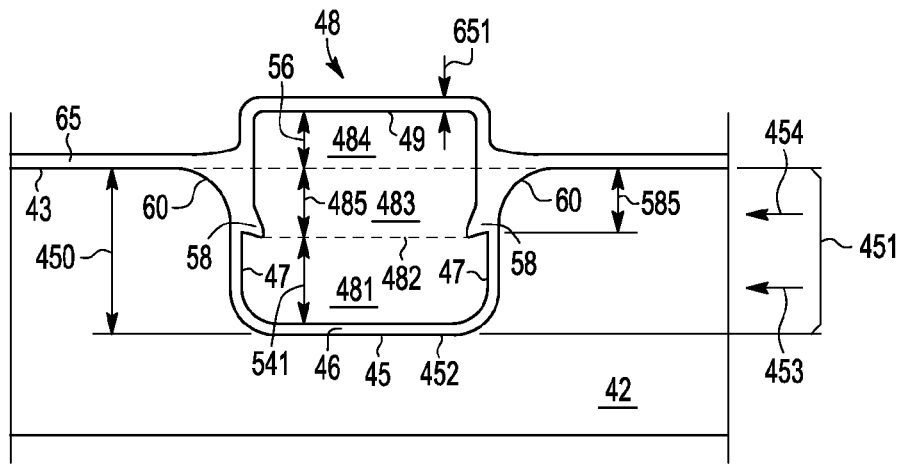

Referring now to manufacturing stage 515 of FIG. 15, those portions of dielectric layer 55 overlying substrate upper surface 43 of structure 614 are removed, e.g., by isotropic etching. Plasma etching is a non-limiting example of a suitable method for removing dielectric layer 55 to the level of substrate upper surface 43, but other etching techniques may also be used. By sampling the etchant gases used in plasma etching, etching may be conveniently stopped upon detecting the presence of atoms of substrate 42 indicating that upper surface 43 of substrate 42 has been reached. In this way, upper dielectric portion(s) 465 proximate curved shape 60 may be left substantially undisturbed. Structure 615 results. Referring now to manufacturing stage 516 of FIG. 16, dielectric layer 65 of thickness 651 is formed over the exposed portions of substrate 42 and gate conductor 48. Thermal growth is a non-limiting example of a suitable method for forming dielectric layer 65 and silicon oxide is a non-limiting example of a suitable material for layer 65, but other materials and formation techniques may also be used. Structure 616 results.

Figure 17:
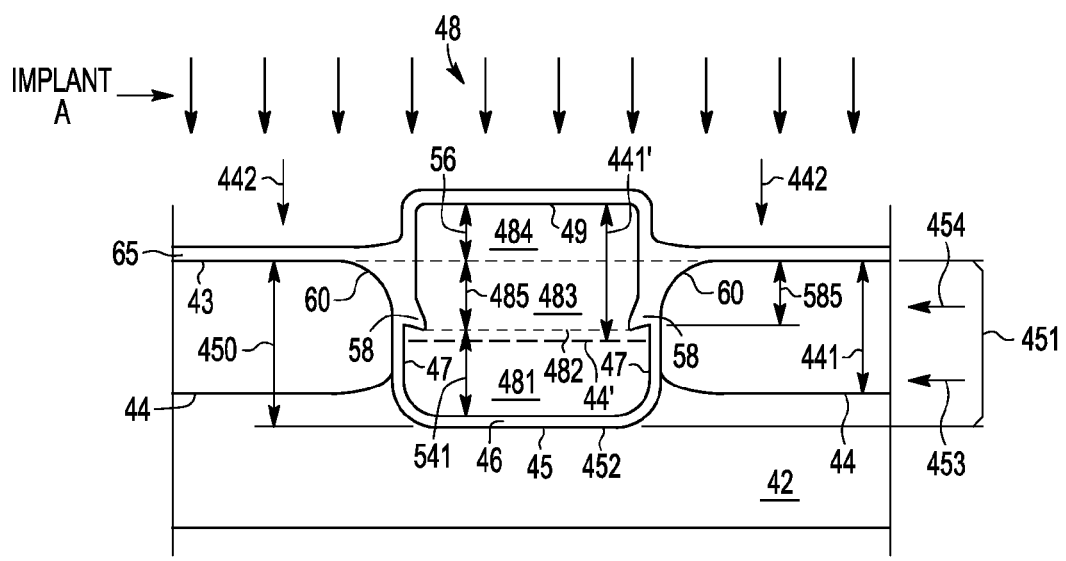

Referring now to manufacturing stage 517 of FIG. 17, Implant A (e.g., P type) is desirably provided into substrate 42 and gate conductor 48. Body region(s) 44 (e.g., P type) of depth 441 in substrate 42 are formed underlying exposed portions 442. Since no mask is illustrated, doped region 44' of similar depth 441' is also formed in gate conductor 48, but this is not essential. Boron is a non-limiting example of a suitable implant dopant for forming body region(s) 44. at energies in the range of about 10 to 200 KeV to doses in the range of about 1E12 to 1E15 ions/cm$^2$, and multiple doping is also possible. Depth 441 of body region(s) 44 is usefully in the range of about 0.5 to 1.8 um, but larger or smaller depths may also be used. In any case, body region(s) depth 441 is desirably greater than depth 585 of the lower extremity of dielectric protrusions 58 and the expected depth of source region(s) 50 of FIGS. 2-3, and less than depth 450 to bottom 452 of cavity 45. Final depth 441 of body region(s) 40 includes the further diffusion of the dopant of Implant A induced by thermal driving, typically by annealing in a furnace at temperature around 1050° C. for a period of approximately 80 min in a nitrogen ambient, but other gases, times and temperatures may also be used. Structure 617 results.

Figure 18:
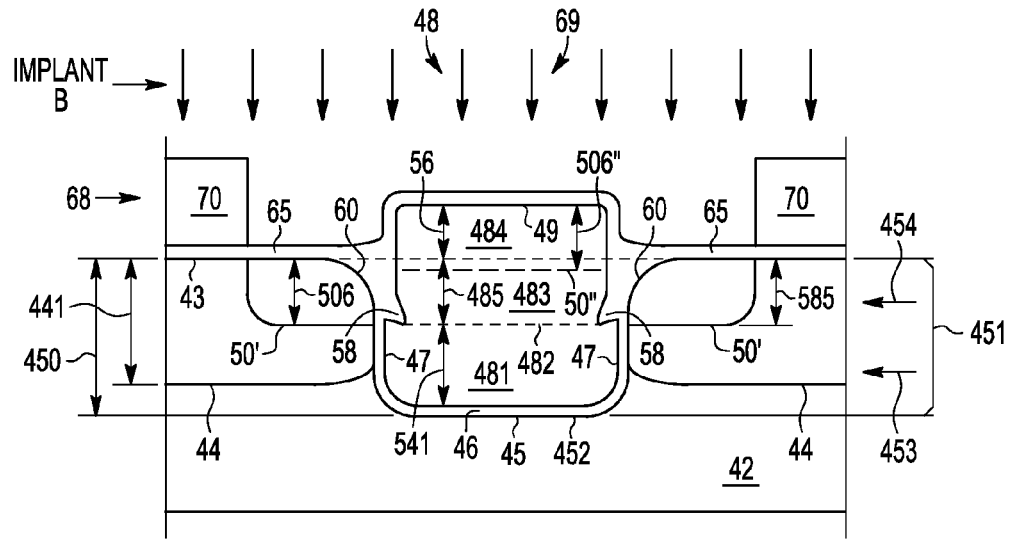

Referring now to manufacturing stage 518 of FIG. 18, mask 68 is provided having open portion 69 and closed portion(s) 70 protecting part of the body region(s) 40 from Implant B. Implant B (e.g., N-type) is provided into the portions of structure 617 exposed under open portion 69, into body region(s) 44 and optionally also into gate conductor 48. Implant B is intended to form initial source region(s) 50' of depth 506 in body region(s) 44 and, optionally, region(s) 50" of the same doping and substantially similar penetration 506" in gate conductor 48. Arsenic is a non-limiting example of a suitable dopant for forming initial source region(s) 50', but other impurities and combinations of impurities may also be used. The doping of initial source region(s) 50' is usefully at energies in the range of about 10 to 200 KeV to doses in the range of about 1E14 to 1E16 ions/cm$^2$, but higher or lower doses and depth varying doping can also be used. Depth 506 is usefully in the range of about 20 to 200 nm, but larger or smaller depths may also be used. Depth 506 is desirably similar to or greater than depth 585 below substrate upper surface 43 so that eventual lower extremity 507 of final source region(s) 50 (e.g., see FIG. 3) is located in depth proximate to or deeper than depth 585 of dielectric protrusions 58. Annealing of Implant B is desirably carried out to activate the dopant, anneal-off any implant defects and fine-tune the source to body junction depth. By way of example and not limitation, for silicon semiconductors annealing can be performed at approximately 800° C. to 1000° C. for approximately 15 min to 1 hour, in an inert ambient. Structure 618 results.

Figure 19:
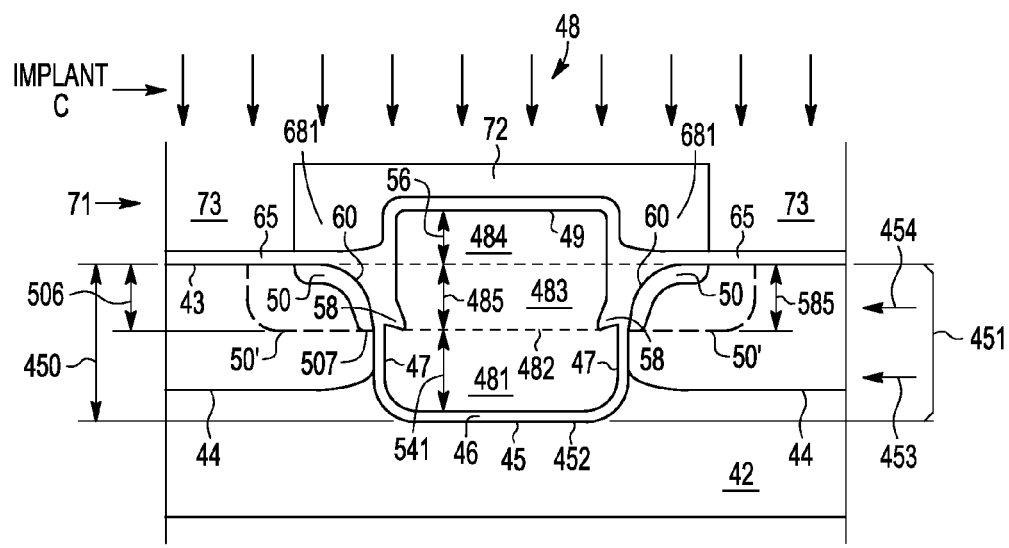

Referring now to manufacturing stage 519 of FIG. 19, mask 68 is removed and mask 71 is provided over structure 618, having closed portion 72 and opening(s) 73. Implant C (e.g., P type) is provided through open opening(s) 73 of mask 71 into body region(s) 44 and also partly into initial source region(s) 50'. The purpose of Implant C is as a body implant that facilitates subsequent Ohmic source-metal to body contact, but that also locally counter-dopes initial source region(s) 50' so that final source region(s) 50 may have laterally non-uniform depth. For example, it is desirable that final source region(s) 50 have a somewhat "banana" like shape with lower extremity 507 of depth 506 adjacent to curved shape 60 and gate dielectric 46 along upper sidewall region(s) 454 of cavity 45 and gate conductor 48, and shallower depth 501 (see FIG. 3) away from upper sidewall region(s) 454 and curved shape 60, but this is not essential. In other embodiments, final source region 50 may have a much more constant depth from surface 43. Either arrangement is useful. In a preferred embodiment, the banana like shape is obtained by using a depth varying (e.g., chain implant) doping procedure for Implant C, where the peak doping concentration, in part, increases with depth from surface 43. The amount of lateral diffusion of the compensating impurities of Implant C is then greater at depths away from surface 43 than at surface 43. Thus, final source region(s) 50 can have the shape and properties illustrated in connection with FIGS. 2-3 and with lower extremity 507 facing gate dielectric 46 and gate conductor 48 proximate dielectric protrusion 58. Boron is a non-limiting example of a suitable dopant for Implant C, at energies in the range of about 10 to 250 KeV to doses in the range of about 1E12 to 1E16 ions/cm², but larger or smaller doses and energies may also be used, including multiple energy doping. The energy and dose of Implant C are desirably adjusted, taking into account the depth and dose of Implant B of initial source region(s) 50' and Implant A of body region(s) 44, so that final source region(s) 50 desirably but not essentially have lower extremity 507 at or below depth 585 of the lower extremity of dielectric protrusions 58. Structure 619 results.

Figure 20:
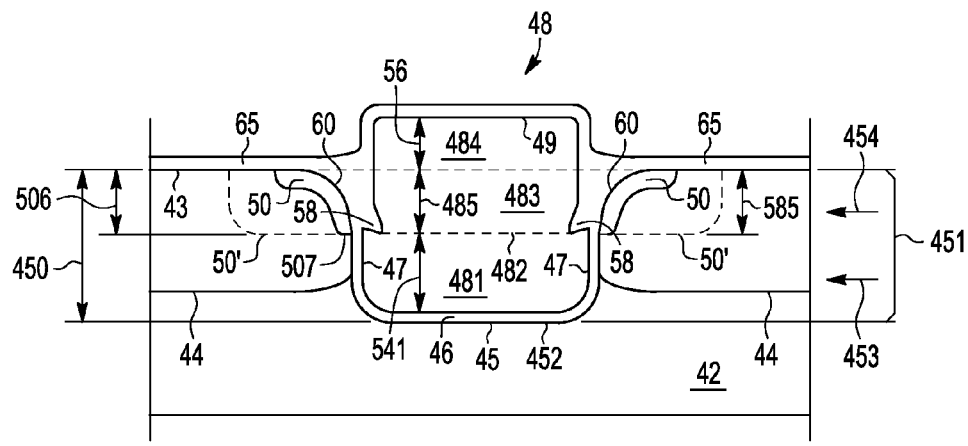
Figure 21:
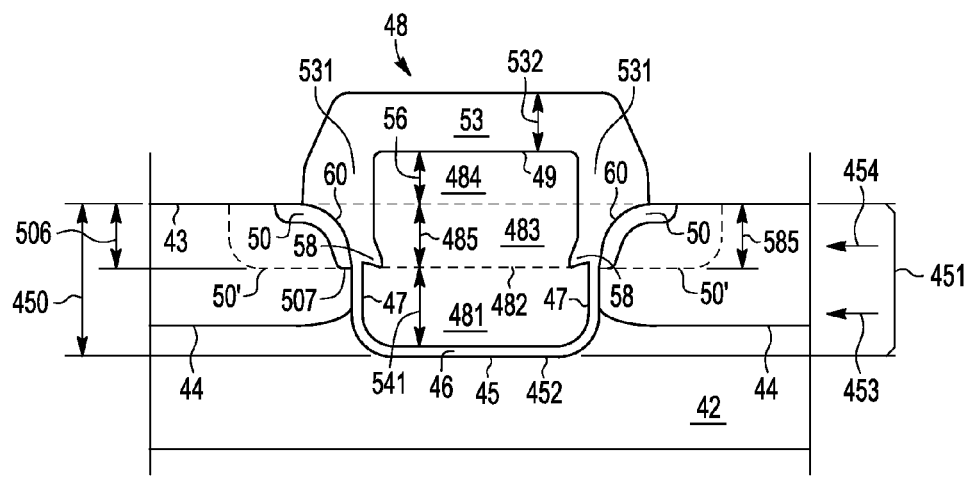
Figure 22:
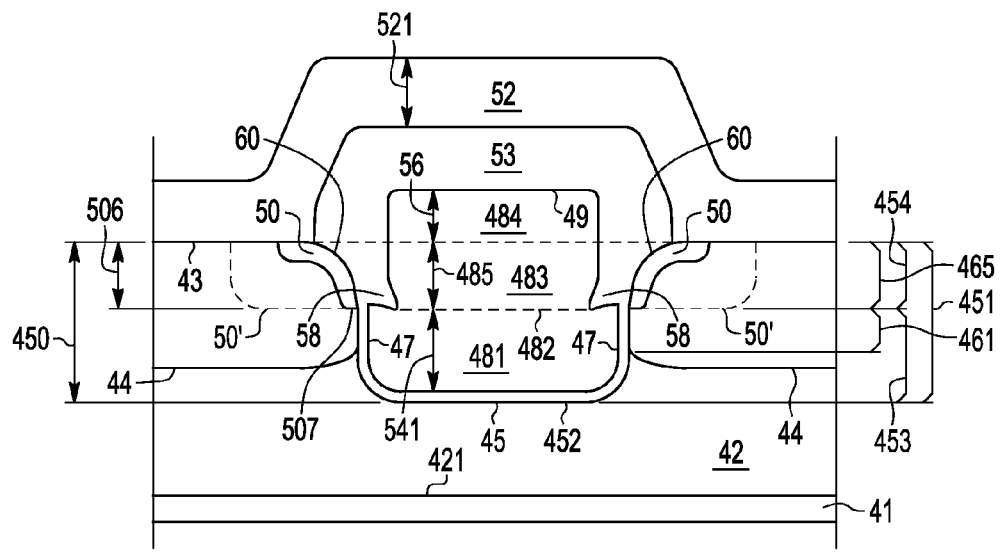

Referring now to manufacturing stage 520 of FIG. 20, mask 71 is removed. Structure 620 results. Referring now to manufacturing stage 521 of FIG. 21, dielectric region 53 is provided over gate conductor 48 with surface portions of body region(s) 44 and final source region(s) 50 exposed. Thickness 531 is desirably in the range of about 200 to 1000 nm, but thicker or thinner layers may also be used. Silicon oxide is a non-limiting example of a useful material for dielectric region 53, but other insulating materials may also be used. Structure 621 results. Referring now to manufacturing stage 522 of FIG. 22, source lead 52 is provided over structure 621, thereby making Ohmic electrical contact to source region(s) 50 and, in this example, also to body region(s) 44. In the same or other manufacturing stages, drain and drain contact 41 is provided on lower surface 421 of substrate 42. Manufacturing stages 520 through 522 are conventional. Power MOSFET 40 is then substantially complete. Persons of skill in the art will understand that further back-end operations may be performed to integrate power MOSFET 40 with other elements that may be present on the same or other substrates.

Figure 23:
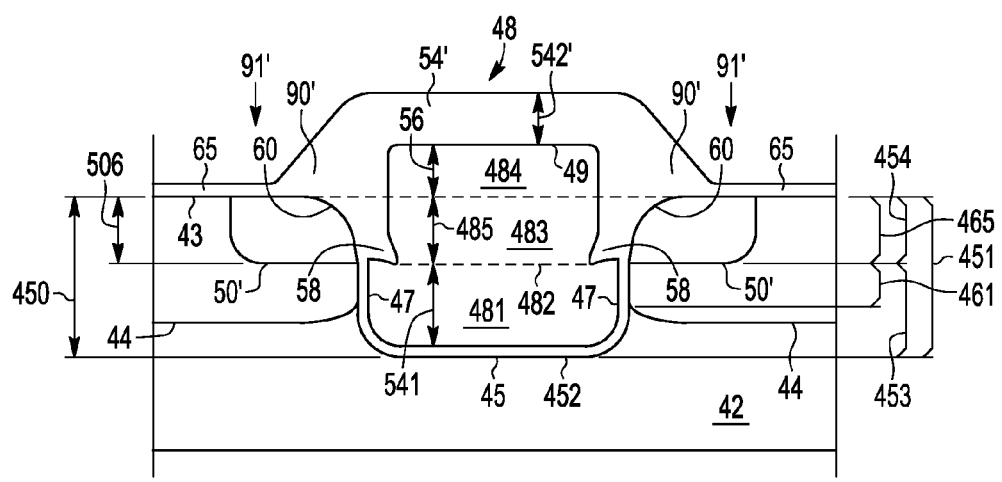
Figure 24:
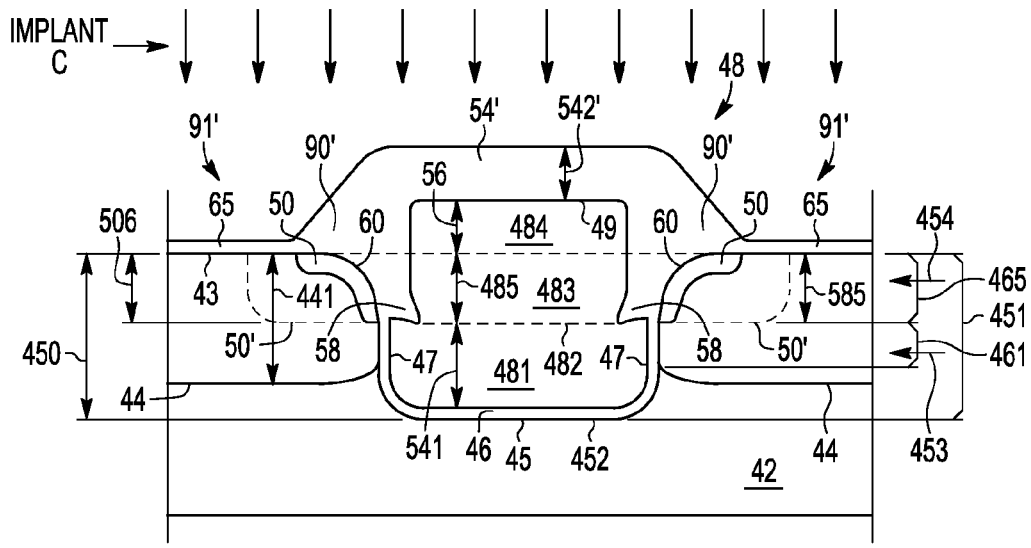
Figure 25:
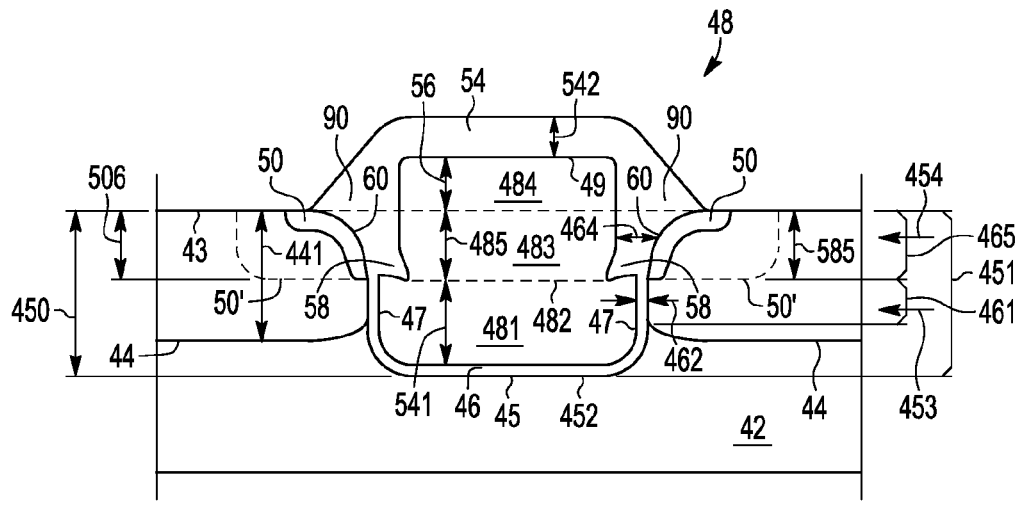

FIGS. 23-25 depict alternative manufacturing stages 523-525 according to yet further embodiments of the invention. Referring now to manufacturing stage 523 of FIG. 23, manufacturing stage 523 proceeds from manufacturing stage 518 of FIG. 18. Implant B has been completed, mask 68 removed, and structure 618 is being prepared for Implant C. Implant C provided during manufacturing stage 519 of FIG. 19, employed mask 71 and a chain implant. In manufacturing stage 523, rather than providing mask 71, a dielectric layer is deposited and a maskless isotropic etch used to form dielectric region 54'. Dielectric region 54' of thickness 542' and having sidewall spacer region(s) 90' and thinner portion(s) 91', is provided over gate conductor C, adjacent body region(s) 44 and initial source region(s) 50'. Thinner portions 91' may consist simply of remaining portions of layer 65 of FIG. 16, but this is not essential. Dielectric region 54' with spacer region(s) 90' is conveniently formed of silicon oxide using, for example, tetra-ethyl-ortho-silicate (TEOS) deposition, but other dielectric formation techniques well known in the art may also be used. Thickness 542' of dielectric region 54' is conveniently in the range of about 100 to 1000 nm, but thicker and thinner regions or layers may also be used. Structure 623 results after Implant B. Manufacturing stage 524 of FIG. 24, illustrates the consequences of Implant C, wherein final source region(s) 50 of non-uniform depth 501 (e.g., see FIG. 3) and with lower extremity 507 at depth 506 from substrate upper surface 43 are formed proximate dielectric layer 46 on upper sidewall portion 454. The banana-like shape of final source region(s) 50 shown in FIG. 24-25 (and FIG. 3) results from the shadowing effect of spacer region(s) 90' during Implant C of FIG. 24. Structure 624 results.

Referring now to manufacturing stage 525 of FIG. 25, structure 625 is formed wherein portions of body region(s) 44 and source region(s) 50 are exposed on substrate upper surface 43 while gate conductor 48 remains covered by dielectric region 54 of thickness 542. Dielectric region 54 may be formed, for example, by: (a), etching of dielectric region 54', or (b) by removing region 54' and replacing it with dielectric region 53 of FIG. 21. Dielectric region 54 of FIG. 25 is functionally equivalent to dielectric region 53 of FIGS. 2, 3 and 21. In either case, part of body region(s) 44 and part of final source region(s) 50 are exposed on substrate upper surface 43, while gate conductor 48 is still covered by dielectric region 54, 53 of thickness 542, 532. Structure 625 results. Structure 625 is the functional equivalent of structure 621 of FIG. 21. Structure 625 then proceeds to the equivalent of manufacturing stage 522 of FIG. 22 wherein source lead 52 is provided making Ohmic contact to final source region(s) 50 and in this example also to body region(s) 44. Power MOSFET 40 is now substantially complete. Persons of skill in the art will understand that further back-end operations may be performed to integrate power MOSFET 40 with other elements that may be present on the same or other substrates.

According to a first embodiment, there is provided an insulated gate field transistor (40), comprising, a semiconductor containing substrate (42) having a first surface (43), a cavity (45) formed in the substrate (42) and having a sidewall (451) extending to a first depth (450) from the first surface (43), a dielectric liner (46) in the cavity (45), a gate conductor (48) within the dielectric liner (46), at least filling the cavity (45) and extending a first distance (56) above the first surface (43), one or more body region(s) (44) within the substrate (42), extending to a second depth (441) from the first surface (43) and laterally proximate to but separated from the gate conductor (48) in part by a first portion (461) of the dielectric liner (46) of a first thickness (462), one or more source region(s) (50) within the body region(s) (44) extending from the first surface (43) and having a lower extremity (507) at a third depth (506) less than the second depth (441) below the first surface (43), wherein the source region(s) (50) are separated from the gate conductor (48) by a second portion (465) of the dielectric liner (46) of a second thickness (464) at least in part greater then the first lateral thickness (462).

According to a further embodiment, the dielectric liner includes a dielectric protrusion (58) extending laterally into the gate conductor (48) away from the body region(s) (44) and of a fourth depth (585) below the first surface (43). According to a still further embodiment, the second thickness (464) decreases at least partly with increasing depth (501) from the first surface (43) toward the dielectric protrusion (58). According to a yet further embodiment, the fourth depth (585) is approximately equal to or less than the third depth (506). According to a still yet further embodiment, the source region(s) (50) have a curved shape (60) along the second portion (454) of the cavity sidewall (451). According to a yet still further embodiment, the source region(s) (50) have a thickness (505) in a direction substantially perpendicular to the curved shape (60) (no need claim this, it could be variable along the curved shape). According to another embodiment, the first distance (56) is greater than zero. According to a yet another embodiment, the gate conductor (48) has a first cross-sectional width (486) proximate the second portion (465) of the dielectric liner (46) and a larger second cross-sectional width (487) proximate the first portion (461) of the dielectric liner (46).

According to a second embodiment, there is provided a method for forming a MOSFET (40), comprising, providing a substrate (42) of a first conductivity type, having a substrate upper surface (43), forming a substrate cavity (45) of a cavity depth (450) in the substrate (42) from the substrate upper surface (43), the substrate cavity (45) having a cavity bottom (452) and a cavity sidewall (451) extending toward the substrate upper surface (43), the cavity sidewall (451) having a lower sidewall portion (453) and having an upper sidewall portion (454) with a curved shape (60), via which the cavity sidewall (451) joins the substrate upper surface (43), forming a dielectric liner (46) on the cavity sidewall (451), wherein the dielectric liner (46) has a lower liner portion (461) of a lower liner thickness (462) substantially on the lower sidewall portion (453), and wherein the dielectric liner (46) has an upper liner portion (465) proximate the upper sidewall portion (454) and with an upper liner thickness (464), wherein the upper liner thickness (464) exceeds the lower liner thickness (462) in at least part of the upper sidewall portion (454), forming a gate conductor (48) at least partly within the dielectric liner (46) of the substrate cavity (45), the gate conductor (48) having a first gate conductor portion (481) proximate the lower liner portion (461), a second gate conductor portion (483) overlying the first gate portion (481) proximate the upper liner portion (465), and a third gate conductor portion (484) above the substrate upper surface (43) for a gate extension distance (56), forming one or more body region(s) (44) in the substrate (42) of a body region depth (441) from the upper substrate surface (43), laterally proximate the dielectric liner (46) and of a second opposite conductivity type, and forming one or more final source region(s) (50) within the body region(s) (44), extending substantially to the substrate upper surface (43) and proximate the dielectric liner (46), and having a lower source extremity (507) of a source extremity depth (506) beneath the substrate upper surface (43) that is less than the body region depth (441).

According to a further embodiment, forming the gate conductor (48) comprises, filling the cavity (45) within the dielectric liner (46) with an initial gate conductor (481") extending above the substrate upper surface (43), removing an upper part of the initial gate conductor (481") leaving behind an initial first gate conductor portion (481') of the initial gate conductor (481") having an initial upper gate conductor surface (482') lying at a third depth (485') below the substrate upper surface (43) and leaving behind an upper sidewall portion (483') of the initial gate conductor (481") proximate an initial upper liner portion (465'), converting an upper part of the first gate portion (481') to a temporary dielectric region (581') of temporary thickness (582') and converting the upper sidewall portion (483') to a further dielectric region (583') on the initial upper liner portion (465'), leaving a first gate portion (481) of the initial gate conductor (481") in the cavity (45), wherein the first gate portion (481) has an upper gate conductor surface (482) lying at a fourth depth (485) below the upper substrate surface (43), anisotropically removing the temporary dielectric region (581') and part of the further dielectric region (583'), substantially exposing the upper gate conductor surface (482) and providing the upper liner thickness (464) of the dielectric liner (46) in the upper liner portion (465), and covering the upper surface (482) of the first gate portion (481) with the second gate portion (483) and the third gate portion (484) having a fourth upper surface (49) separated from the upper substrate surface (43) by the gate extension distance (56), the combination of the first gate portion (481), the second gate portion (483) and the third gate portion (484) forming the gate conductor (48) of the MOSFET (40).

According to a yet further embodiment, forming the gate conductor (48) comprises forming the gate conductor (48) having a first lateral cross-sectional width (486) proximate the upper liner portion (465) and a larger second lateral cross-sectional width (487) proximate the lower liner portion (461).

According to a still yet further embodiment, forming the final source region(s) (50) comprises, forming initial source region(s) (50') of the first conductivity type, occupying an initial volume within the body region(s) (44), and non-uniformly counter doping a portion of the initial source region(s) (50') with impurities of the second, opposite conductivity type, thereby providing the final source region(s) (50) occupying a smaller volume within the body region(s) (44) than the initial source region(s) (50'). According to a yet still further embodiment, counter doping of the initial source region(s) (50') occurs, at least in part, in locations away from the dielectric liner (46) so that the final source region(s) (50) lie proximate the upper sidewall portion (454). According to another embodiment, forming the dielectric liner (46) includes forming a dielectric protrusion (58) extending laterally into the gate conductor (48). According to a still another embodiment, forming the dielectric protrusion (58) comprises forming a dielectric protrusion (58) located proximate the lower source extremity (507). According to yet another embodiment, the method comprises forming a dielectric protrusion (58) located approximately at an intersection of the lower liner portion (461) and the upper liner portion (465).

According to a third embodiment, there is provided a method for forming a power MOSFET (40) having final source region(s) (50), drain region and contact (41) and gate conductor (48), comprising, providing a semiconductor containing substrate (42) of a first conductivity type having a first upper surface (43), forming above the first upper surface (43) a first dielectric region (64') having a lower boundary (642') at a first depth (643') below the first surface (43), the lower boundary (642') coupled to the first surface (43) by an initial upper sidewall region (454') with initial curved shape (60"), excavating a passage (645) of a first width (631) extending through the first dielectric region (64') to the lower boundary (642'), forming a cavity (45) in the substrate (42) beneath the lower boundary (642') and having a second depth (450) beneath the first upper surface (43) and a second width (456') larger than the first width (631), the cavity (45) having a bottom (452') and sidewall region (451'), wherein the sidewall region (451') is coupled to the first upper surface (43) by the initial curved shape (60"), providing a dielectric liner (46) covering the bottom (452) lower sidewall (453) and curved region (60) of the cavity (45) in the substrate (42), the dielectric liner having a first thickness (462) on the bottom (451) and a lower sidewall (453) of the cavity (45) and an initial second thickness (464') proximate the curved shape (60) at least partly greater than the first thickness (462), filling the cavity (45) within the dielectric liner (46) with an initial gate conductor (481") extending above the first upper surface (43) of the substrate (42), removing an upper part of the initial gate conductor (481") leaving behind a first portion (481') of the initial gate conductor (481") having a second upper surface (482') lying at a third depth (485') below the first surface (43) of the substrate (42) and leaving behind an upper sidewall portion (483') of the initial gate conductor (481") proximate the curved region (60), converting an upper part of the first portion (481') to a second dielectric region (581') of third thickness (582') and converting the upper sidewall portion (483') to a third dielectric region (583'), leaving behind within the cavity (45) a residual portion (481) of the initial gate conductor (481"), wherein the residual portion (481) has a third upper surface (482) lying at a fourth depth (485) below the first upper surface (43) of the substrate (42), substantially anisotropically removing the second dielectric region (581') and part of the third dielectric region (583'), thereby substantially exposing the third upper surface (482) of the residual portion (481) and providing a greater thickness (464) of the dielectric liner (46) proximate the curved region (60) of the substrate (42), covering the third upper surface (482) of the residual portion (481) with a further gate conductor (484, 483) having a fourth upper surface (49) located a first distance (56) from the surface (43) of the substrate (42), which with the residual portion (481) form the gate conductor (48) of the MOSFET (40), wherein the further gate conductor (484, 483) is laterally separated from the substrate (42) at least in part by an upper portion (465) of the dielectric liner (46), forming a body region (44) of a second, opposite, conductivity type, extending into the substrate (42) by body region distance (441) from substrate surface (43), and located laterally proximate the gate conductor (48) but separated therefrom by the dielectric liner (46), forming a source region (50) of the first conductivity type in the body region (44) proximate the upper portion (465) of the dielectric liner (46) and extending to a fifth depth (506) from the substrate surface (43) less than the body region distance (441), and providing a source lead (52) overlying and insulated from the gate conductor (48) and in Ohmic contact at least with the source region (50).

According to a further embodiment, forming the source region (50) comprises, forming an initial source region (50') of the first conductivity type, occupying an initial volume within the body region (44), and counter doping a portion of the initial source region (50') with impurities of the second, opposite conductivity type, thereby providing the source region (50) occupying a smaller volume within the body region (44) than the initial source region (50'). According to a still further embodiment, providing the dielectric liner (46) includes forming a dielectric protrusion (58) extending laterally into the gate conductor (48). According to a yet further embodiment, forming the dielectric protrusion (58) comprises forming the dielectric protrusion (58) approximately at the intersection of the upper portion (465) of the dielectric liner (46) and a thinner lower portion (461) of the dielectric liner (46).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

The invention claimed is:

1. A method for forming a MOSFET, comprising:
    providing a substrate of a first conductivity type, having a substrate upper surface;
    forming a substrate cavity of a cavity depth in the substrate from the substrate upper surface, the substrate cavity having a cavity bottom and a cavity sidewall extending toward the substrate upper surface, the cavity sidewall having a lower sidewall portion and having an upper sidewall portion with a curved shape, via which the cavity sidewall joins the substrate upper surface;
    forming a dielectric liner on the cavity sidewall, wherein the dielectric liner has a lower liner portion of a lower liner thickness substantially on the lower sidewall portion, and wherein the dielectric liner has an upper liner portion proximate the upper sidewall portion and with an upper liner thickness, wherein the upper liner thickness exceeds the lower liner thickness in at least part of the upper sidewall portion;
    forming a gate conductor at least partly within the dielectric liner of the substrate cavity, the gate conductor having a first gate conductor portion proximate the lower liner portion, a second gate conductor portion overlying the first gate portion proximate the upper liner portion, and a third gate conductor portion above the substrate upper surface for a gate extension distance;
    forming one or more body regions in the substrate of a body region depth from the upper substrate surface, laterally proximate the dielectric liner and of a second opposite conductivity type; and
    forming one or more final source regions within the body regions, extending substantially to the substrate upper surface and proximate the dielectric liner, and having a lower source extremity of a source extremity depth beneath the substrate upper surface that is less than the body region depth, and
    wherein forming the dielectric liner includes forming a dielectric protrusion extending laterally into the gate conductor.

2. The method of claim 1, wherein forming the gate conductor comprises:
    filling the cavity within the dielectric liner with an initial gate conductor extending above the substrate upper surface;
    removing an upper part of the initial gate conductor leaving behind an initial first gate conductor portion of the initial gate conductor having an initial upper gate conductor surface lying at a third depth below the substrate upper surface and leaving behind an upper sidewall portion of the initial gate conductor proximate an initial upper liner portion;
    converting an upper part of the first gate portion to a temporary dielectric region of temporary thickness and converting the upper sidewall portion to a further dielectric region on the initial upper liner portion, leaving a first gate portion of the initial gate conductor in the cavity, wherein the first gate portion has an upper gate conductor surface lying at a fourth depth below the upper substrate surface;
    anisotropically removing the temporary dielectric region and part of the further dielectric region, substantially exposing the upper gate conductor surface and providing the upper liner thickness of the dielectric liner in the upper liner portion; and
    covering the upper surface of the first gate portion with the second gate portion and the third gate portion having a fourth upper surface separated from the upper substrate surface by the gate extension distance, the combination of the first gate portion, the second gate portion and the third gate portion forming the gate conductor of the MOSFET.

3. The method of claim 1, wherein the gate conductor has a first lateral cross-sectional width proximate the upper liner portion and a larger second lateral cross-sectional width proximate the lower liner portion.

4. The method of claim 1, wherein forming the final source regions comprises:
    forming initial source regions of the first conductivity type, occupying an initial volume within the body regions; and
    counter doping a portion of the initial source regions with impurities of the second, opposite conductivity type, thereby providing the final source regions occupying a smaller volume within the body regions than the initial source regions.

5. The method of claim 4, wherein counter doping of the initial source regions occurs, at least in part, in locations away from the dielectric liner so that the final source regions lie proximate the upper sidewall portion.

6. The method of claim 1, wherein the dielectric protrusion is located proximate the lower source extremity.

7. The method of claim 1, wherein the dielectric protrusion is located approximately at an intersection of the lower liner portion and the upper liner portion.

8. A method for forming a power MOSFET having final source region, drain region and contact and gate conductor, comprising:
   providing a semiconductor containing substrate of a first conductivity type having a first upper surface;
   forming above the first upper surface a first dielectric region having a lower boundary at a first depth below the first surface, the lower boundary coupled to the first surface by an initial upper sidewall region with an initial curved shape;
   excavating a passage of a first width extending through the first dielectric region to the lower boundary;
   forming a cavity in the substrate beneath the lower boundary and having a second depth beneath the first upper surface and a second width larger than the first width, the cavity having a bottom and sidewall region, wherein the sidewall region is coupled to the first upper surface by the initial curved shape;
   providing a dielectric liner covering the bottom lower sidewall and curved region of the cavity in the substrate, the dielectric liner having a first thickness on the bottom and a lower sidewall of the cavity and an initial second thickness proximate the curved shape at least partly greater than the first thickness;
   filling the cavity within the dielectric liner with an initial gate conductor extending above the first upper surface of the substrate;
   removing an upper part of the initial gate conductor leaving behind a first portion of the initial gate conductor having a second upper surface lying at a third depth below the first surface of the substrate and leaving behind an upper sidewall portion of the initial gate conductor proximate the curved region;
   converting an upper part of the first portion to a second dielectric region of third thickness and converting the upper sidewall portion to a third dielectric region, leaving behind within the cavity a residual portion of the initial gate conductor, wherein the residual portion has a third upper surface lying at a fourth depth below the first upper surface of the substrate;
   substantially anisotropically removing the second dielectric region and part of the third dielectric region, thereby substantially exposing the third upper surface of the residual portion and providing a greater lateral thickness of the dielectric liner proximate the curved region of the substrate;
   covering the third upper surface of the residual portion with a further gate conductor having a fourth upper surface located a first distance from the surface of the substrate, which with the residual portion form the gate conductor of the MOSFET, wherein the further gate conductor is laterally separated from the substrate at least in part by an upper portion of the dielectric liner;
   forming a body region of a second, opposite, conductivity type, extending into the substrate by body region distance from substrate surface, and located laterally proximate the gate conductor but separated therefrom by the dielectric liner;
   forming a source region of the first conductivity type in the body region proximate the upper portion of the dielectric liner and extending to a fifth depth from the substrate surface less than the body region distance; and
   providing a source lead overlying and insulated from the gate conductor and in Ohmic contact at least with the source region, and
   wherein providing the dielectric liner includes forming a dielectric protrusion extending laterally into the gate conductor.

9. The method of claim 8, wherein forming the source region comprises:
   forming an initial source region of the first conductivity type, occupying an initial volume within the body region; and
   counter doping a portion of the initial source region with impurities of the second, opposite conductivity type, thereby providing the source region occupying a smaller volume within the body region than the initial source region.

10. The method of claim 8, wherein forming the dielectric protrusion comprises forming the dielectric protrusion approximately at the intersection of the upper portion of the dielectric liner and a thinner lower portion of the dielectric liner.

* * * * *